(12) United States Patent
Chen et al.

(10) Patent No.: US 8,153,523 B2
(45) Date of Patent: Apr. 10, 2012

(54) METHOD OF ETCHING A LAYER OF A SEMICONDUCTOR DEVICE USING AN ETCHANT LAYER

(75) Inventors: Ryan Chia-Jen Chen, Chiayi (TW); Yi-Hsing Chen, Changhua (TW); Ching-Yu Chang, Yuansun Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 429 days.

(21) Appl. No.: 12/362,174

(22) Filed: Jan. 29, 2009

(65) Prior Publication Data
US 2010/0068884 A1 Mar. 18, 2010

Related U.S. Application Data

(60) Provisional application No. 61/096,490, filed on Sep. 12, 2008.

(51) Int. Cl.
*H01L 21/44* (2006.01)

(52) U.S. Cl. .............. 438/684; 216/100; 216/6; 216/95; 216/62; 216/88; 438/694; 438/745; 438/782; 438/48; 438/283; 134/1; 134/26

(58) Field of Classification Search ............ 216/62, 216/63, 100, 6, 95, 88, 97; 438/694, 745, 438/782, 48, 283, 705, 770, 706, 736, 692, 438/763, 514
See application file for complete search history.

(56) References Cited

U.S. PATENT DOCUMENTS

| | | | | |
|---|---|---|---|---|
| 3,156,593 A * | 11/1964 | Ligenza | ........................ | 438/565 |
| 6,123,865 A * | 9/2000 | Lin et al. | ........................ | 216/91 |
| 6,261,953 B1 | 7/2001 | Uozumi | | |
| 6,525,009 B2 * | 2/2003 | Sachdev et al. | ................ | 510/175 |
| 7,098,143 B2 * | 8/2006 | Rusli | .............................. | 438/734 |
| 7,129,182 B2 * | 10/2006 | Brask et al. | ................... | 438/745 |
| 2004/0112868 A1 * | 6/2004 | Phipps | ......................... | 216/100 |
| 2005/0012975 A1 * | 1/2005 | George et al. | ................... | 359/223 |
| 2005/0058929 A1 * | 3/2005 | Kennedy et al. | ........... | 430/270.1 |
| 2006/0263520 A1 * | 11/2006 | Kang et al. | .................... | 427/240 |

\* cited by examiner

*Primary Examiner* — Duy Deo
*Assistant Examiner* — Erin Flanagan
(74) *Attorney, Agent, or Firm* — Haynes and Boone, LLP

(57) ABSTRACT

A method of semiconductor fabrication including an etching process is provided. The method includes providing a substrate and forming a target layer on the substrate. An etchant layer is formed on the target layer. The etchant layer reacts with the target layer and etches a portion of the target layer. In an embodiment, an atomic layer of the target layer is etched. The etchant layer is then removed from the substrate. The process may be iterated any number of times to remove a desired amount of the target layer. In an embodiment, the method provides for decreased lateral etching. The etchant layer may provide for improved control in forming patterns in thin target layers such as, capping layers or high-k dielectric layers of a gate structure.

13 Claims, 5 Drawing Sheets

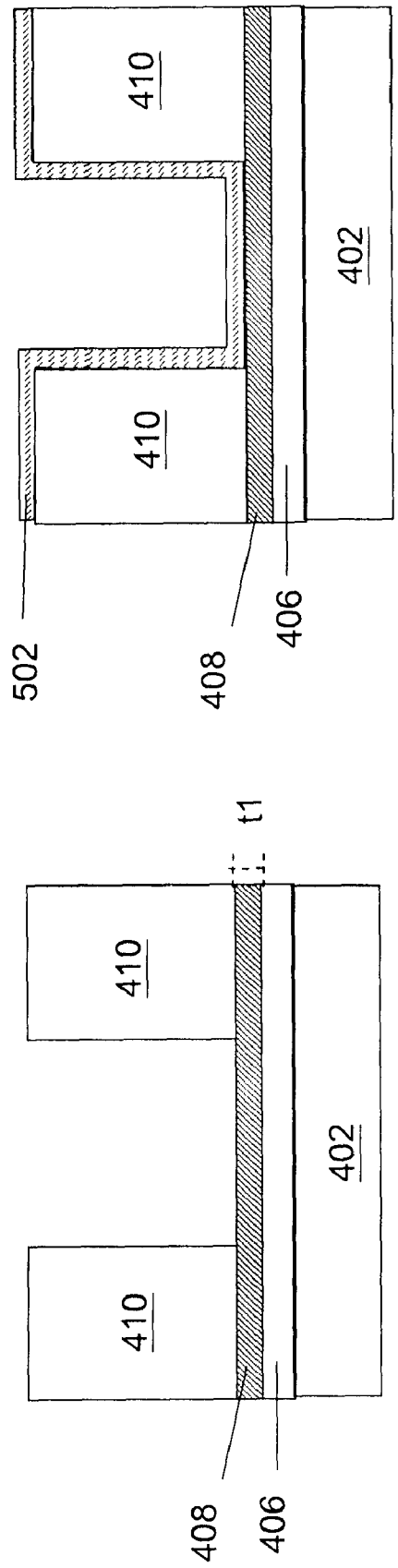

METHOD OF ETCHING A LAYER OF A SEMICONDUCTOR DEVICE USING AN ETCHANT LAYER

PRIORITY DATA

This application claims priority to Provisional Application Ser. No. 61/096,490 filed on Sep. 12, 2008, entitled "METHOD OF ETCHING A LAYER OF A SEMICONDUCTOR DEVICE USING AN ETCHANT LAYER", the entire disclosure of which is incorporated herein by reference.

BACKGROUND

The present disclosure relates generally to a semiconductor device, such as a semiconductor integrated circuit, and more particularly to a method of semiconductor device fabrication including an etching process.

A typical semiconductor fabrication process includes forming a masking element such as, a photoresist feature, on a layer that is to be patterned. The masking element protects a portion of the layer such that the open portions of the layer can be etched. Conventional etching processes include wet etching and dry etching. The isotropic nature of the etching process, in particular for wet etching, can cause issues with the transfer of a pattern from the masking element to the target layer however. This is particularly a concern where the target layer is very thin. Undercutting (e.g., removal of the target layer beneath the masking element) may caused by a lateral component of an isotropic etch. The undercutting may provide defects in patterning of the target layer such as imprecise dimension control. The undercutting can also reduce the surface area of adhesion between the masking element and the substrate, which may lead to defects such as peeling of the masking element during subsequent processes. Though a dry etch process may lessen the isotropic nature of the etch, it may introduce further problems such as, damage to the masking element, target layer, and/or underlying layers. These issues may be especially critical in fabricating a semiconductor device including a high-k gate dielectric/metal gate structure. The gate structure may include thin layers for which dimensions must be tightly controlled during patterning.

Therefore, what is desired is an improved method of etching a layer of a semiconductor device.

SUMMARY

In one embodiment, a method of fabricating a semiconductor device is provided. The method includes forming a target layer on a semiconductor substrate. An etchant layer is formed on the target layer. A portion of the target layer is etched using the etchant layer. In one embodiment, the etchant layer is formed using a spin-coating process. In one embodiment, the etchant layer includes a polymer, a solvent, and an etchant component. The etchant component may include a functional group. The functional group may include Cl, $SO_4$, $SO_3$, $CO_2$, and/or suitable compositions.

In another embodiment, a method of fabricating a semiconductor device including a gate structure is provided. A semiconductor substrate is provided. A high-k dielectric layer is formed on the substrate. A capping layer is formed on the high-k dielectric layer. An etchant layer on the capping layer. The first etchant layer etches the capping layer. In one embodiment, a metal gate is formed on the capping layer.

In yet another embodiment, a method of fabricating a semiconductor device is provided including providing a semiconductor substrate and forming a target layer on the substrate. A masking element is formed on the target layer. The masking element defines an open region of the target layer and a protected region of the target layer. An etchant layer is deposited on the substrate. The etchant layer includes an interface with the open region of the target layer. An atomic layer of the open region of the target layer is removed using the etchant layer. The etchant layer is removed from the substrate after the etching of the open region. In an embodiment, the target layer includes a metal oxide. In an embodiment, a second atomic layer may be removed from the target layer using a second etchant layer.

BRIEF DESCRIPTION OF THE DRAWINGS

FIGS. 4-8 are cross-sectional views illustrating an embodiment of a substrate corresponding to steps of the method of FIG. 3.

DETAILED DESCRIPTION

Figure 1:
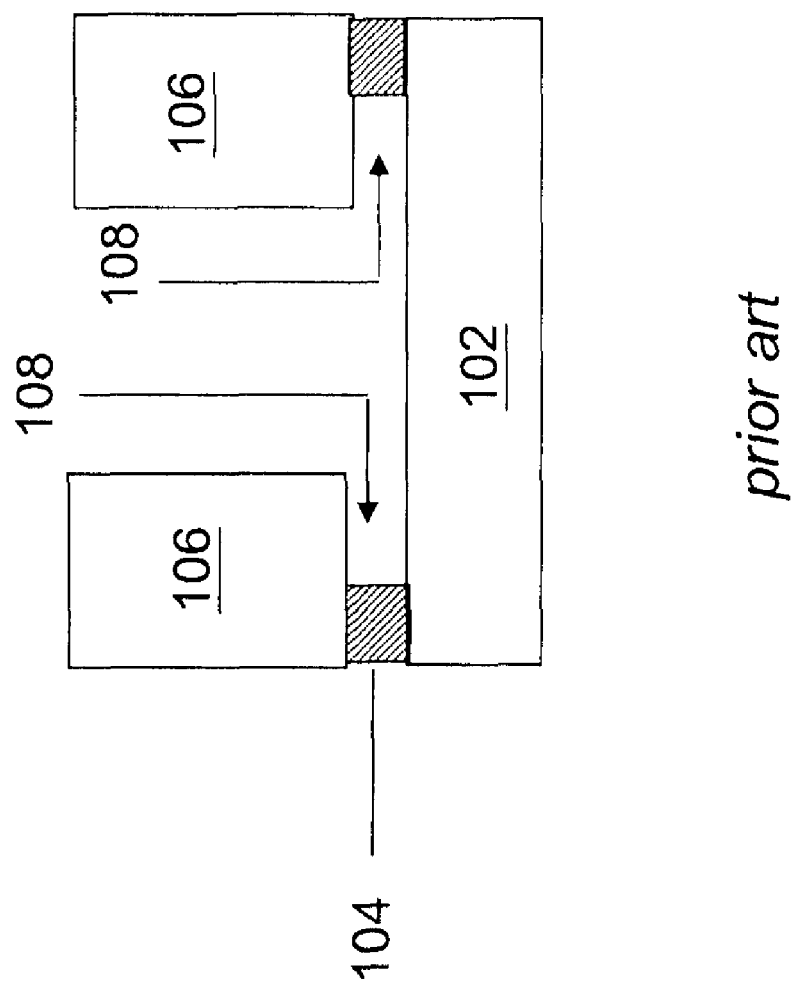
FIG. 1 is a cross-sectional view illustrating an embodiment of a conventional semiconductor device including undercutting.

The present disclosure relates generally to forming a semiconductor device on a substrate and, more particularly, to an etching process used to pattern a layer of a semiconductor device. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Furthermore, included are descriptions of a first layer or feature "on," "overlying," and like descriptions, a second layer or feature. These terms include embodiments where the first and second layer are in direct contact and those where one or more layers or feature are interposing the first and second layer.

Referring now to FIG. 1, illustrated is a cross-sectional view of a conventional semiconductor device 100. The device includes a substrate 102, a target layer 104 (e.g., a layer to be patterned), and a plurality of masking elements 106. The masking elements 106 protect (mask) a portion of the target layer 104 leaving portions open (e.g., exposed). The masking elements 106 typically include photoresist material. However, other materials may be possible including metals, dielectrics, hard masks, and/or other suitable masking materials. An etching process has been performed which removed the open portion of the target layer 104 (e.g., not underlying the masking elements 106). However, the semiconductor device 100 illustrates a disadvantage of conventional processes. The target layer 104 includes undercutting as illustrated by recesses 108. The recesses 108 underlie the masking elements 106. This region of the target layer 104, though it may not be intended to be removed, is etched away by the isotropic-nature of an etching process.

The recesses 108 make it difficult to control the dimensions of a pattern formed on the target layer 104. Furthermore, during subsequent processing, the masking elements 106 may cause defects. For example, as the surface area of adhesion between the masking elements and the target layer 104 is decreased, the masking elements may more easily peel-off of the substrate 102.

Figure 2:
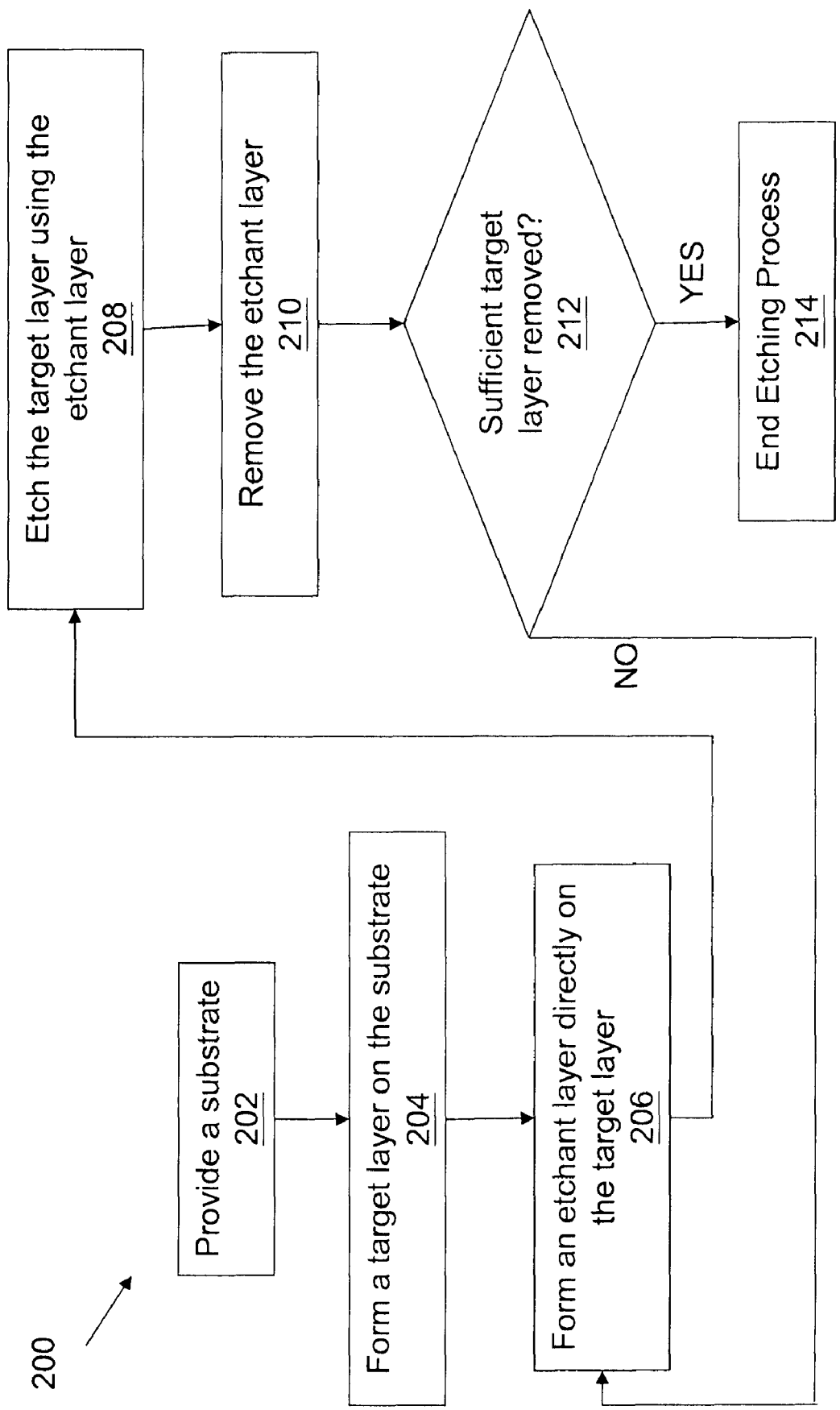
FIG. 2 is a flowchart illustrating an embodiment of a method of semiconductor fabrication including etching a target layer.

Referring now to FIG. 2, illustrated is a method 200 for etching a target layer of a semiconductor substrate. The etching may include patterning a target layer and/or performing a blanket etch of a target layer. The method 200 may be included during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and other suitable devices.

The method 200 begins at step 202 where a substrate is provided. In an embodiment, the substrate includes a silicon substrate (e.g., wafer) in crystalline structure. Other examples of the substrate may include other elementary semiconductors such as germanium and diamond. Alternatively, the substrate may include a compound semiconductor such as, silicon carbide, gallium arsenide, indium arsenide, or indium phosphide. The substrate may include various doping configurations depending on design requirements (e.g., p-type substrate or n-type substrate). Further, the substrate may include an epitaxial layer (epi layer), may be strained for performance enhancement, and/or may include a silicon-on-insulator (SOI) structure. The substrate may include active regions, isolation regions, isolation features such as, shallow trench isolation (STI) structures, conductive layers, semiconductor layers, insulator layers, and/or other suitable features.

The method 200 then proceeds to step 204 where a target layer is formed on the substrate. The target layer may include any layer of material that is to be etched including, for example, a dielectric layer, a conductive layer, an insulator layer, and/or other suitable layers. In an embodiment, a masking element is formed on the target layer.

The method 200 then proceeds to step 206 where an etchant layer (or film) is formed on the target layer. The etchant layer includes an interface with the target layer such that the etchant layer is in direct contact with the target layer. In an embodiment, a masking element interposes the etchant layer and the target layer for at least a portion of the target layer (e.g., providing a pattern). The etchant layer may include a polymer coating with a etchant component. The etchant component maybe selected such that it will react with the composition of the target layer. The reaction (e.g., a surface reaction) provides for the removal of a portion of the target layer by the etchant layer (e.g., etchant component).

In an embodiment, the etchant layer includes a polymer, a solvent, and an etchant component. The polymer may provide for the etchant layer to hold its shape and consistency. The polymer may be substantially similar to a polymer used in a photoresist composition. The solvent may provide appropriate consistency and fluidity of the etchant layer material and etchant component. In an embodiment, the solvent is substantially similar to a solvent used in a photoresist composition. The etchant component may include a functional group. The etchant component (e.g., functional group) may react with the composition of the target layer. The reaction provides for the etching (e.g., removal) of the target layer.

The target layer may be formed by a spin-coating process. Other deposition processes may also be suitable such as, chemical vapor deposition, atomic layer deposition, physical vapor deposition, and/or other suitable processes. In an embodiment, a soft bake process is performed after forming the etchant layer. Examples of bake process temperatures include 90, 110, and/or 130 C, by way of example and not intended to be limiting.

The method 200 then proceeds to step 208 where the target layer is etched by the etchant layer. In particular, the etchant component of the etchant layer may react with the composition of the target layer to remove a portion of the target layer. In an embodiment, steps 206 and 208 are substantially concurrent. The etching component (e.g., functional group) of the etchant layer reacts with the target layer at the interface of the layers (e.g., the surface of the target layer). The reaction may be substantially constrained to only the regions of the physical interface of the etchant layer and the target layer (e.g., surface reaction). The reaction may be self-limiting. In an embodiment, an atomic layer of the target layer is removed by the etchant layer (e.g., the reaction is self-limiting). The etch rate may be dependent upon material and/or temperature provided. A bake process, such as a soft bake, may increase the etch rate.

The beneficial control of the etching process may be apparent. The etchant layer may etch (e.g., remove) the target layer at the interface of the etchant layer and the target layer. Thus, etching using the etchant layer may provide for minimal lateral etching. This may allow for precise etch control, for example, in terms of controlling dimensions of a pattern to be formed and/or an amount of material to be removed.

The method 200 then proceeds to step 210 where the etchant layer is removed from the substrate. The etchant layer may include components produced from the reaction with the target layer (reaction products). The etchant layer may be removed using an ashing process, a stripping solution, a developer, and/or other suitable processes known in the art. In an embodiment, the etchant layer includes a polymer of a negative-tone photoresist. A developer solution suitable for use with the negative-tone photoresist polymer may be used to remove the etchant layer.

The method 200 then proceeds to step 212 where it is determined if a sufficient portion target layer has been removed. In an embodiment, it is determined that additional portion of the target layer should be removed (e.g., further etching is required). The method 200 returns to step 206 where another etchant layer is formed on the target layer. The subsequent etchant layer may include the same composition as the first etchant layer. The method 200 may proceed substantially as described above with reference to steps 206, 208, and 210. In an embodiment, an additional atomic layer is removed by the subsequent etchant layer. Any number of iterations of etching using an etchant layer to etch a portion of the target layer (e.g., steps 206, 208, and 210) may be performed. In each iteration, additional etching of the target layer occurs. In an embodiment, each iteration provides for the removal an atomic layer of the target layer. In an embodiment, at step 212 a sufficient thickness of the target layer has been achieved and the method 200 proceeds to step 214 where the etching process is terminated. In an embodiment, the target layer has been substantially removed from the open areas of the substrate. The fabrication process step may proceed to other suitable semiconductor fabrication processes.

Therefore, the method 200 provides for increased control of an etching process using an etchant layer (e.g., film) formed on the layer to be etched. The etchant layer is a solid composition, as opposed to a liquid composition of conventional wet etch solutions. Using the etchant layer allows for control of the lateral etching component of the etch useful, for example, when patterning a layer.

Figure 3:
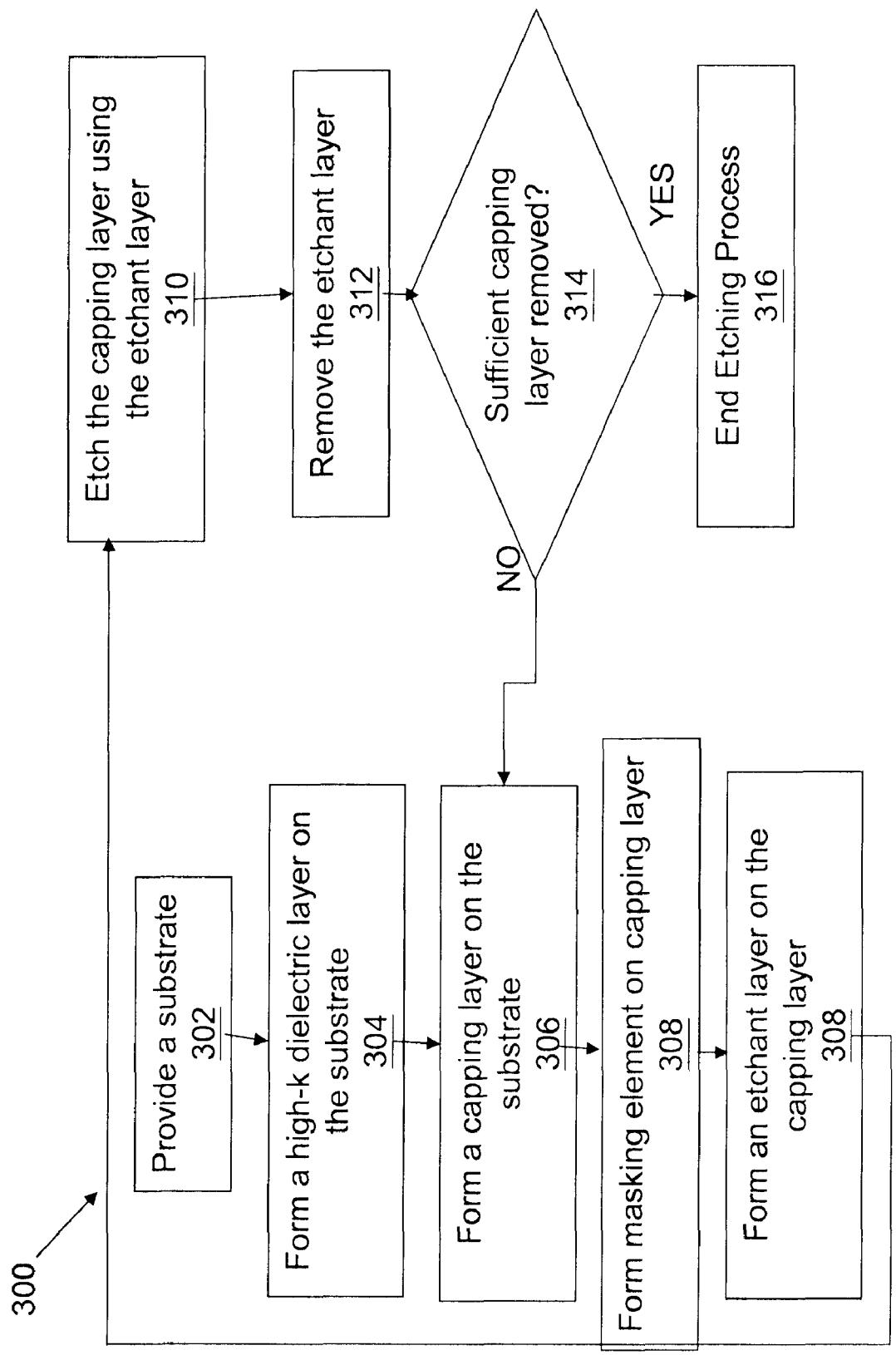
FIG. 3 is a flowchart illustrating an embodiment of the method of FIG. 2, the method of FIG. 3 including etching a pattern in a layer of a gate structure.
Figure 7:
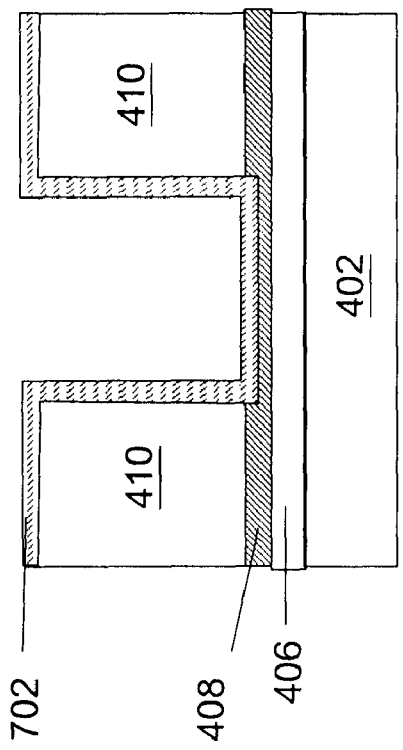

Referring now to FIG. 3, illustrated is a method 300 providing an embodiment of the method 200, described above with reference to FIG. 2. FIGS. 4-8 provide cross-sectional views of exemplary devices fabricated according to steps of the method 300. It should be noted that the method 300 provides an exemplary embodiment only and is not intended to limit the scope of application of the present disclosure including the method 200.

The method 300 begins at step 302 where a substrate is provided. The substrate may be substantially similar to a substrate provided in step 202 of the method 200, described above with reference to FIG. 2. Referring to the example of FIG. 4, a substrate 402 is provided. In an embodiment, the substrate 402 includes a silicon substrate (e.g., wafer) in crystalline structure. Other examples of the substrate 402 may include other elementary semiconductors such as germanium and diamond. Alternatively, the substrate 402 may include a compound semiconductor such as, silicon carbide, gallium arsenide, indium arsenide, or indium phosphide. The substrate 402 may include various doping configurations depending on design requirements (e.g., p-type substrate or n-type substrate). Further, the substrate 402 may include an epitaxial layer (epi layer), may be strained for performance enhancement, and/or may include a silicon-on-insulator (SOI) structure. The substrate may include isolation regions, active regions, doped regions, dielectric layers, conductive layers, and/or other suitable features.

The method 300 then proceeds to step 304 where a high-k dielectric layer is formed on the substrate. The high-k dielectric layer may function as a gate dielectric layer. Referring to the example of FIG. 4, a high-k dielectric layer 406 is provided. In an embodiment, an interface layer may be disposed between the high-k dielectric layer 406 and the substrate 402. The interface layer may include silicon, oxygen, and/or nitrogen. In an embodiment the interface layer is $SiO_2$. An interface layer may be formed by atomic layer deposition (ALD), thermal oxidation, and/or other suitable process. The gate dielectric layers includes a high-k (high dielectric constant relative to a conventional silicon oxide) material. In an embodiment, the high-k dielectric material includes hafnium oxide ($HfO_2$). Other examples of high-k dielectrics include hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. The high-k gate dielectric layer 402 may be formed using ALD, PVD, CVD, and/or other suitable processes.

The method 300 then proceeds to step 306 where a capping layer is formed on the substrate. The capping layer may be substantially similar to the target layer, described above with reference to the method 200. The capping layer may provide an interface between a gate dielectric layer and an overlying gate electrode layer. In an embodiment, the capping layer contributes to the work function of a metal gate. The capping layer may be between approximately 10 and 15 Angstroms in thickness, by way of example and not intended to be limiting. The capping layer may be formed using processes such as, CVD, PVD, plating, oxidation, and/or other suitable process. Referring to the example of FIG. 4, a capping layer 408 is formed. The capping layer 408 may include a metal oxide. The capping layer 408 may include $La_2O_3$, DyO, $Al_2O_3$, and/or other suitable compositions. The capping layer 408 includes a thickness t1 (e.g., 10-15 angstroms).

The method 300 then proceeds to step 308 where one or more masking elements are formed on the capping layer. In an embodiment, the masking elements include photoresist. The masking elements may also include metal, dielectric, hard mask material, in addition to or in lieu of the photoresist. The masking elements may be formed using processes such as, spin-coating, photolithography processes including exposure, bake, and development processes, etching (including ashing or stripping processes), and/or other processes known in the art. The masking elements may provide a pattern including protecting (e.g., covering) a portion of the capping layer and exposing (e.g., leaving open) a portion of the capping layer. In an embodiment, the masking elements provide a pattern associated with forming a gate structure.

The method 300 then proceeds to step 310 where an etchant layer is formed. The etchant layer may be formed on the masking elements and the capping layer. The etchant layer may be substantially similar to the etchant layer described with reference to step 206 of the method 200 of FIG. 2. For example, the etchant layer may include a polymer, a solvent, and an etchant component. The forming of the etchant layer may include deposition such as, by spin-coat process. The deposition may be followed by a bake (e.g., soft bake). Referring to the example of FIG. 5, an etchant layer 502 is formed on the capping layer 408. A direct interface between the etchant layer 502 and the capping layer 408 is formed. The etchant layer 502 includes a composition suitable to react with (e.g., etch) the capping layer 408. The etchant layer 502 may include a polymer, a solvent, and an etchant component (e.g., functional group). The etchant component may be selected such that it etches the capping layer 408 (e.g., metal oxide etchant). For example, the etchant component may be substantially similar to an etchant used in a wet etch solution operable to etch the capping layer 408. In contrast however, the etchant component is provided in solid form in the etchant layer. Examples of etchant components may include components such as, Cl, $SO_4$, $SO_3$, $CO_3$, and/or other suitable components. The etchant layer 502 may include a composition that is selective to the masking elements 410 and/or the high-k gate dielectric 406, in other words, a etchant component of the etchant layer may be selected such that it does not substantially etch the masking components 410 and/or the high-k gate dielectric 406.

The method 300 then proceeds to step 312 where the etchant layer etches (e.g., removes a portion of) the capping layer. Step 312 may occur substantially concurrently with step 310. In an embodiment, a bake process of 310 (e.g., a soft bake) may accelerate the etching rate of the etchant layer. The etching may be substantially similar to as described above with reference to step 208 of the method 200 of FIG. 2. The reaction may be self-limiting. The reaction (e.g., etching) may be a surface reaction. The reaction provided by a single etchant layer may etch one atomic layer from the capping layer.

Referring to the example of FIG. 6, the capping layer 408 has been etched by an etchant layer. A thickness, t2, is provided in the exposed portion of the capping layer 408. The etch is substantially lateral and maintains the thickness t1 underlying the masking elements 410. In an embodiment, the difference between t1 and t2 is substantially equal to an atomic layer of the capping layer.

The method 300 then proceeds to step 314 where the etchant layer is removed from the substrate. Step 314 may be substantially similar to step 210 of the method 200, described above with reference to FIG. 2. The etchant layer, after reacting with the capping layer, may be removed using a liquid solution. The etchant layer may be removed using a developer solution, an ashing process, a wet chemical solution (e.g., stripping process) and/or other suitable processes. Referring to the example of FIG. 6, the etchant layer 502, described with reference to FIG. 5, has been removed.

The method 300 then proceeds to step 316 where it is determined if a sufficient portion of the capping layer has been removed. In an embodiment, it is determined additional etching is needed. The method 300 then returns to step 310 where a subsequent etchant layer is formed on the capping layer. The subsequent etchant layer includes a direct interface to the capping layer. The method 300 may proceed substantially as described above using the subsequent etchant layer to etch a portion of the capping layer further reducing its thickness. Referring to the example of FIG. 7, a second etchant layer 702 is formed on the capping layer 408, the capping layer 408 now having a reduced thickness in open areas (e.g., t2). The etchant layer 702 may be substantially similar to the etchant layer 502.

Figure 8:
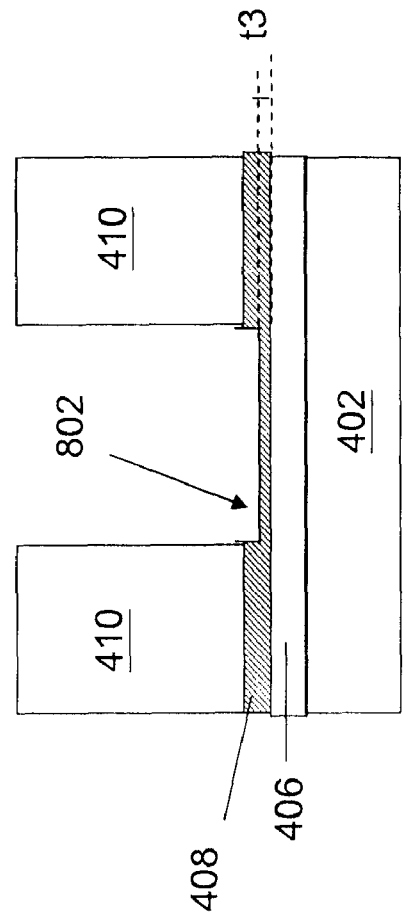

Referring to the example of FIG. 8, the etchant layer 702 has removed a portion of the capping layer 408 further reducing its thickness to t3. In an embodiment, the difference in thickness t2 and t3 is approximately an atomic layer. The etchant layer 702 has been removed from the substrate 402 such as described above with reference to step 312. Any number of iterations of the process (e.g., steps 310, 312, 314) may be provided. In an embodiment, the method 300 continues until the capping layer 408 is substantially removed from the substrate 402 in the open areas (not masked by the masking element 410). In an embodiment, the etchant layer may be selective to the high-k dielectric layer 406 such that the high-k dielectric layer 406 is minimally etched by the etchant layer.

In an embodiment, at step 316 it is determined that a sufficient portion of the capping layer has been removed and the method 300 proceeds to step 318 where the etching process is terminated.

The method 300 may proceed to further include forming a metal gate structure. The metal gate may include one or more layers including Ti, TiN, TaN, Ta, TaC, TaSiN, W, WN, MoN, MoON, $RuO_2$, and/or other suitable materials. The gate may include one or more layers formed by PVD, CVD, ALD, plating, and/or other suitable processes. Examples of metals that may be deposited include p-type metal materials and n-type metal materials. P-type metal materials include compositions such as ruthenium, palladium, platinum, cobalt, nickel, and conductive metal oxides, and/or other suitable materials. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials. Other materials may deposited in addition to the work function metals (e.g., fill metals) and may include titanium nitride, tungsten, titanium, aluminum, tantalum, tantalum nitride, cobalt, copper, nickel, and/or other suitable materials.

In embodiments, the method 300 may also continue to include further processing steps such as formation of interconnects, capping layers, and/or other suitable features. The method 300 may be included in a gate-first or a gate-last metal gate fabrication process. A gate-last process may include forming a sacrificial dummy gate structure (e.g., polysilicon gate) that is subsequently removed to provide a trench in which a metal gate is formed. The gate last process may be beneficial in protecting the metal gate from damage incurred during processing (e.g., high temperature).

Though the method 300 is illustrated as etching a capping layer of a high-k metal gate structure, numerous other embodiments are possible. For example, similar methods may be used to etch a pattern in the high-k gate dielectric layer, interface layer, and/or other layers of the high-k metal gate structure. Furthermore, embodiments of the method 300 may be used to form structures other than high-k metal gate structures.

In summary, method is provided for etching a layer using an etchant layer. The etchant layer (a solid) includes a composition such that it will etch an underlying target layer. The etchant layer may provide an etching process that is substantially limited to a surface reaction between the etchant layer and a target layer. Therefore, the etching process may be more tightly controlled. For example, lateral etching (e.g., isotropic etching) may be reduced.

While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A method of fabricating a semiconductor device comprising:
   forming a target layer on a semiconductor substrate, the target layer including a first portion over a second portion;
   forming a first etchant layer on the first portion of the target layer
   etching the first portion of the target layer using the first etchant layer such that a surface of the second portion of the target layer is exposed;
   forming a second etchant layer on the exposed surface of the second portion of the target layer; and etching the second portion of the target layer using the second layer, and
   wherein the first and second etchant layers are solid layers, and
   wherein the first and second etchant layers are formed by spin coating.

2. The method of claim 1, further comprising:
   forming a masking element on the target layer.

3. The method of claim 1, wherein the target layer includes a capping layer.

4. The method of claim 1, wherein the target layer includes a high-k gate dielectric layer.

5. The method of claim 1, wherein the first etchant layer includes a polymer.

6. The method of claim 1, wherein the first etchant layer includes an etchant functional group.

7. The method of claim 6, wherein the first etchant functional group is selected from the group consisting of Cl, $SO_4$, $SO_3$, and $CO_2$.

8. A method of fabrication a semiconductor device comprising:
   providing a semiconductor substrate;
   forming a high-k dielectric layer on the substrate;
   forming a capping layer on the high-k dielectric layer;
   forming a first etchant layer on the capping layer
   etching a portion of the capping layer using the first etchant layer such that another portion of the capping layer is exposed underneath the etched portion; removing the first etchant layer, after etching the portion of the capping layer; forming a second etchant layer on the exposed another portion of the capping layer; and etching the another portion of the capping layer using the second etchant layer, and wherein the first and second etchant layers are solid layers, and wherein the first and second etchant layers are formed by spin coating.

9. The method of claim 8, wherein the first etchant layer removes only an atomic layer of the capping layer.

10. The method of claim 8, wherein the capping layer includes a metal oxide selected from the group consisting of $La_2O_3$, $DyO$, and $Al_2O_3$.

11. The method of claim 8, wherein the forming the first etchant layer includes:
performing a soft bake process on the substrate including the first etchant layer.

12. The method of claim 1, wherein etching the first portion of the target layer includes a soft bake process such that an etching rate of the first etchant layer is increased.

13. The method of claim 8, wherein the first etchant layer includes a polymer.

* * * * *